United States Patent
Tsukamoto

(10) Patent No.: US 8,213,892 B2
(45) Date of Patent: Jul. 3, 2012

(54) FM-AM DEMODULATOR AND CONTROL METHOD THEREFOR

(75) Inventor: Nobunari Tsukamoto, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 355 days.

(21) Appl. No.: 12/685,960

(22) Filed: Jan. 12, 2010

(65) Prior Publication Data

US 2010/0197252 A1   Aug. 5, 2010

(30) Foreign Application Priority Data

Feb. 5, 2009  (JP) ................ 2009-024945

(51) Int. Cl.
 *H04B 1/10* (2006.01)
(52) U.S. Cl. .............. 455/302; 455/205; 329/317
(58) Field of Classification Search .......... 455/132, 455/141, 142, 205, 232.1, 302, 307, 334, 455/337, 341; 329/316, 317, 319, 320, 349, 329/353
See application file for complete search history.

(56) References Cited

U.S. PATENT DOCUMENTS

| | | | | | |
|---|---|---|---|---|---|
| 4,388,496 | A | * | 6/1983 | Miyamoto | 381/2 |
| 4,408,097 | A | * | 10/1983 | Bahnsen et al. | 381/15 |
| 4,674,121 | A | * | 6/1987 | Miura et al. | 381/10 |
| 5,418,815 | A | * | 5/1995 | Ishikawa et al. | 375/216 |

FOREIGN PATENT DOCUMENTS

| | | |
|---|---|---|
| JP | 2546331 | 8/1996 |
| JP | 2003-244002 | 8/2003 |
| JP | 2006-121665 | 5/2006 |

* cited by examiner

*Primary Examiner* — Quochien B Vuong
(74) *Attorney, Agent, or Firm* — Cooper & Dunham LLP

(57) ABSTRACT

A FM-AM demodulator includes a FM signal amplifier, a local oscillator, an image oscillator, a first selector, a first orthogonal mixer, an AM signal amplifier, a first frequency divider, a second frequency divider, a second selector, a second orthogonal mixer, a third selector, a first filter, a first amplifier, a fourth selector, a second filter, a second amplifier, a first gain controller, an I/Q compensation unit, an IF oscillator, a third orthogonal mixer, an adder, a channel filter configured to extract a signal with a predetermined frequency band output from the adder, a third amplifier, a second gain controller, a demodulator, and an I/Q compensation controller configured to generate an I/Q compensation signal to use for adjusting phase and gain of the I signal used in an I/Q compensation unit by detecting amplitude of the output signal from the demodulator, and output the generated signal to the I/Q compensation unit.

12 Claims, 3 Drawing Sheets

FM-AM DEMODULATOR AND CONTROL METHOD THEREFOR

TECHNICAL FIELD

The present disclosure relates to an FM-AM demodulator used in FM-AM demodulation, and more particularly, to an FM-AM demodulator achieving high performance demodulation at low cost, and a control method therefor.

BACKGROUND ART

There are two methods generally used as architecture for wireless receivers, a direct-conversion method and a super-heterodyne method. In the direct-conversion method, frequency of a signal carrier is dropped to direct current level by one step. In the super-heterodyne method, a few units at intermediate frequencies are provided to drop the frequency gradually.

The super-heterodyne method has an image signal problem. More specifically, when an input signal is dropped to a signal having an intermediate frequency, a signal (image signal) having a frequency opposite to a desired signal may overlap with the desired signal. If the image signal overlapping with the desired signal is demodulated, signal noise ratio (SNR) may be decreased.

To avoid such a problem, a filter is generally provided in steps before a frequency conversion step by a mixer to perform a predetermined filtering process. As a result, the image signal is fully suppressed and input to the mixer so that the image signal does not overlap with the desired signal.

There is increasing demand for a one-chip solution for recent receivers using Complementary Metal Oxide Semiconductor (CMOS). However, it is difficult to achieve a high-performance filter with the CMOS technology. Further, the one-chip solution requires larger chip size.

Recently, a technology generally called "Low-IF" has been proposed. In the Low-IF technology, the intermediate frequency is set to the lower frequency band. Using this Low-IF technology, a filter circuit and an Automatic Gain Control (AGC) circuit can be achieved easily with simple circuits because the circuits deal with a low intermediate frequency band. Thus, the Low-IF technology provides advantages in power consumption and cost.

If the intermediate frequency band is set below the frequency band used in the Analog-Digital (A/D) converter, the intermediate frequency can be captured into digital without conversion. Accordingly, following demodulation processing can be performed easily by digital circuits.

However, the image signal problem described previously becomes more significant when the Low-IF technology is used. More precisely, when the intermediate frequency is low enough to the carrier frequency, a filter is needed with sharp filtering characteristics at the carrier band. Accordingly, a high-performance filter must be prepared outside of the chip. Consequently, the number of parts increases, resulting in a cost penalty.

For the above-described problem, even if the image signal is included in the signal down-converted by the mixer, a technology using a poli-fuse filter is known to remove such image signal. In this technology, the image signal is removed by filtering with an I signal and a Q signal generated by down-converting the received signal using signals which have a phase difference of 90 degrees.

JP-2006-121665 describes using a poli-fuse filter to remove the image signal. The technology described in JP-2006-121665 achieves high-precision filtering characteristics at low power and low cost by providing a variable frequency filter capable of varying frequency at a following stage after the poli-fuse filter that removes the image signal.

However, the poli-fuse filter is formed of passive elements such as resisters and capacitors. Accordingly, when the intermediate frequency band is low, the passive elements require a large area. Further, receiving sensitivity may be decreased by noise caused by the poli-fuse filter itself.

JP-2546331 describes an active-type filter using elements such as transistors, resisters, and capacitors. However, such an active-type filter still has the same problem of increase in chip size because the time constant of the filter is still determined by the resister and the capacitor.

The Weaver method is well known as a technology to remove the image signal without using a poli-fuse filter. In the Weaver method, the I and Q signals are generated by down-converting the received signal using signals which have a phase difference of 90 degrees (i.e., are orthogonal to each other), and are added to remove the image signal.

When the Weaver method is used, the I and Q signals are required to be perfectly orthogonal and have equal gain. If there are some errors in the phase or the gain between the I and Q signals, it becomes imperfect to remove the image signal. As a result, receiving SNR may be decreased. This factor is important because, in actual CMOS devices, there is variation in operational characteristics of the transistors even if the transistors are formed with the same layout pattern. Thus, it is substantially impossible to match the I and Q signals perfectly without error. Accordingly, it is required to detect an error caused by the circuit and correct it.

To perform this correction operation, an image signal having a different frequency from a local oscillation signal necessary for down-converting by the mixer is required. Accordingly, an oscillator which is not used in the normal receiving operation is required, resulting in increase of chip size.

JP-2003-224002 describes a radio that receives a FM broadcast and an AM broadcast, with the intention of reducing the number of external parts in addition to reducing cost. A frequency of a crystal and an oscillation frequency of an oscillator generated using the crystal are determined so that the oscillation frequency becomes the least common multiple or an integral multiple of a reference frequency of a FM frequency synthesizer, an AM frequency synthesizer, a FM stereo demodulation circuit, and an AM synchronous detection circuit.

Requirement for phase and noise performance of the local oscillator for the AM broadcast is not so high compared to that for the FM broadcast because the AM frequency is lower than the FM frequency. Accordingly, it gives excessive performance to use the local oscillator of the FM broadcast for the AM broadcast, resulting in increase of power consumption.

BRIEF SUMMARY

This patent specification describes a novel FM-AM demodulator includes a FM signal amplifier, a local oscillator, an image oscillator, a first selector, a first orthogonal mixer, an AM signal amplifier, a first frequency divider, a second frequency divider, a second selector, a second orthogonal mixer, a third selector, a first filter, a first amplifier, a fourth selector, a second filter, a second amplifier, a first gain controller, an I/Q compensation unit, an IF oscillator, a third orthogonal mixer, an adder, a channel filter configured to extract a signal with a predetermined frequency band output from the adder, a third amplifier, a second gain controller, a demodulator, and an I/Q compensation controller configured to generate an I/Q compensation signal to use for adjusting phase and gain of the I signal used in an I/Q compensation unit by detecting amplitude of the output signal from the demodulator, and output the generated signal to the I/Q compensation unit.

This patent specification further describes a novel FM-AM demodulator that includes a local oscillator, an image oscillator. When the AM broadcast is received, the image oscillator which has a low noise performance generates the local oscillation signal.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
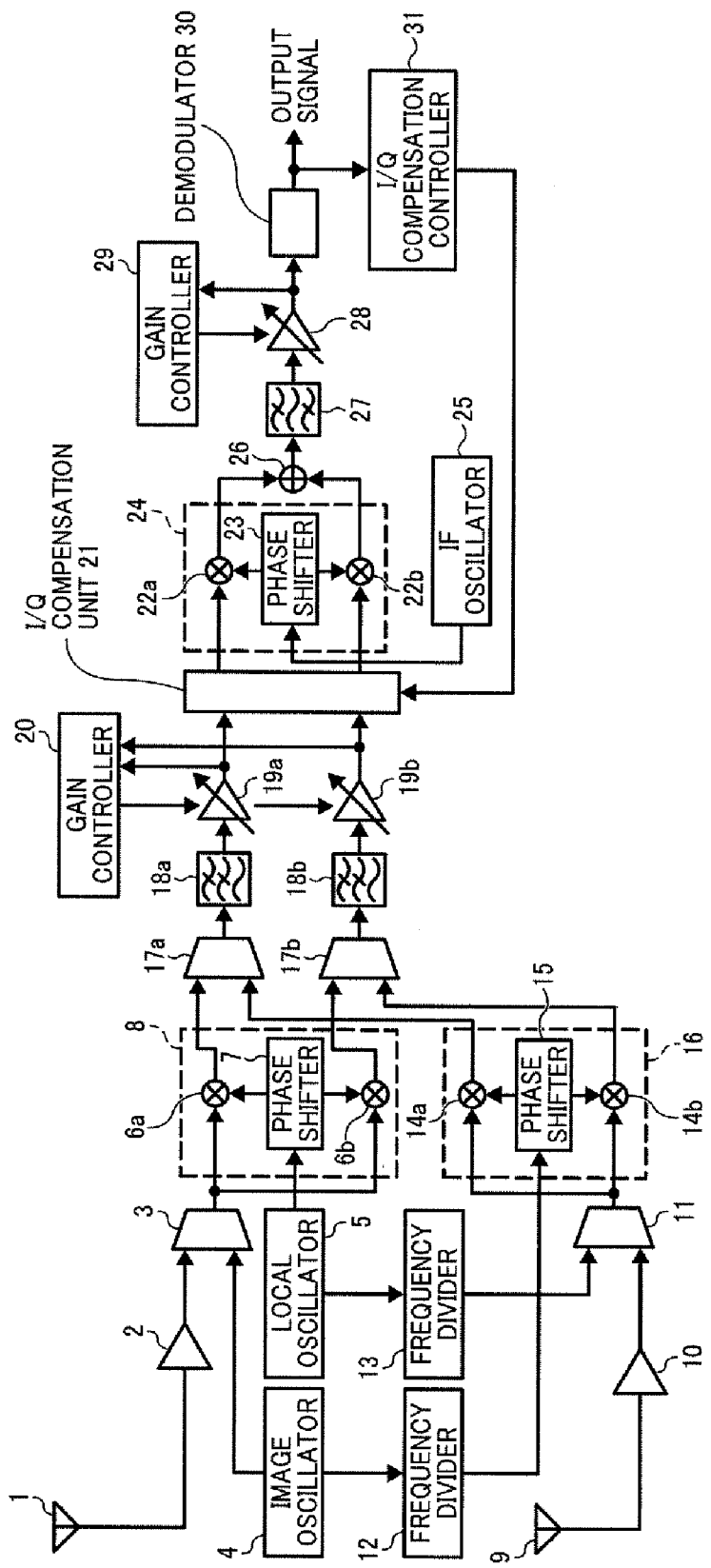
FIG. 1 is a circuit diagram of an FM-AM receiver that includes an FM-AM demodulator according to an illustrative first embodiment.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, particularly to FIG. 1, an FM-AM demodulator according to an illustrative embodiment is described.

Figure 2:
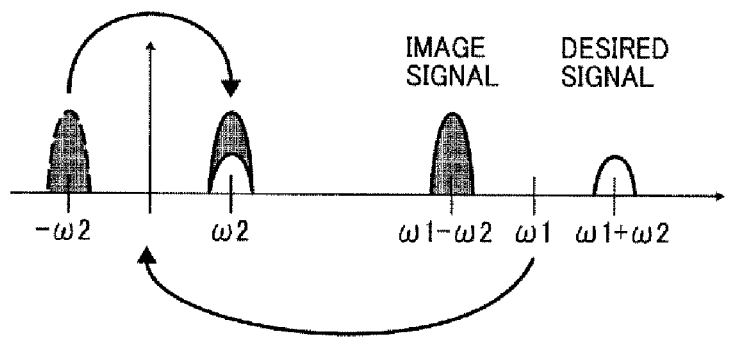
FIG. 2 is a schematic for explaining how the image affects the receiving signal.
Figure 3:
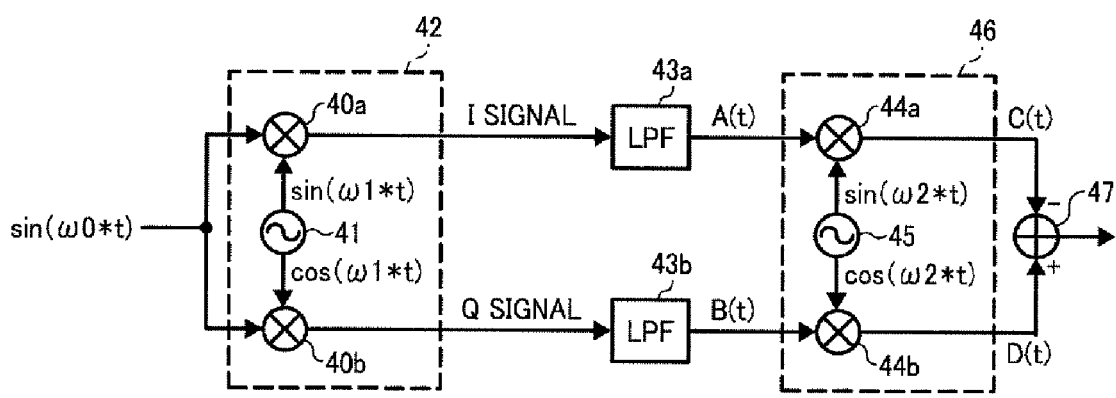
FIG. 3 is a Weaver method circuit that removes the image signal.
Figure 4:
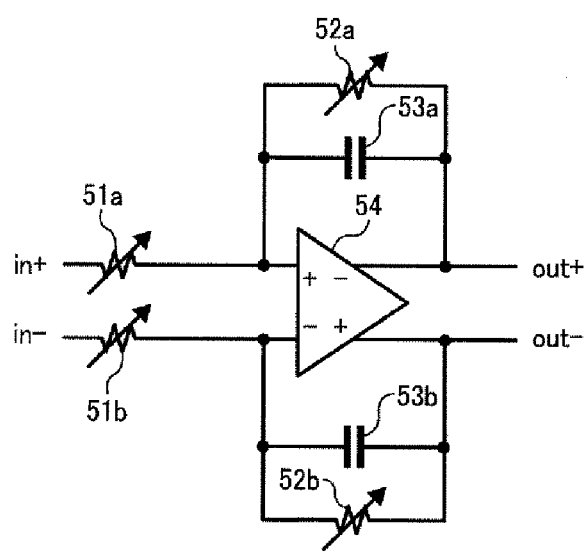
FIG. 4 is a circuit diagram of I/Q compensation unit of the FM-AM demodulator of FIG. 1.
Figure 5:
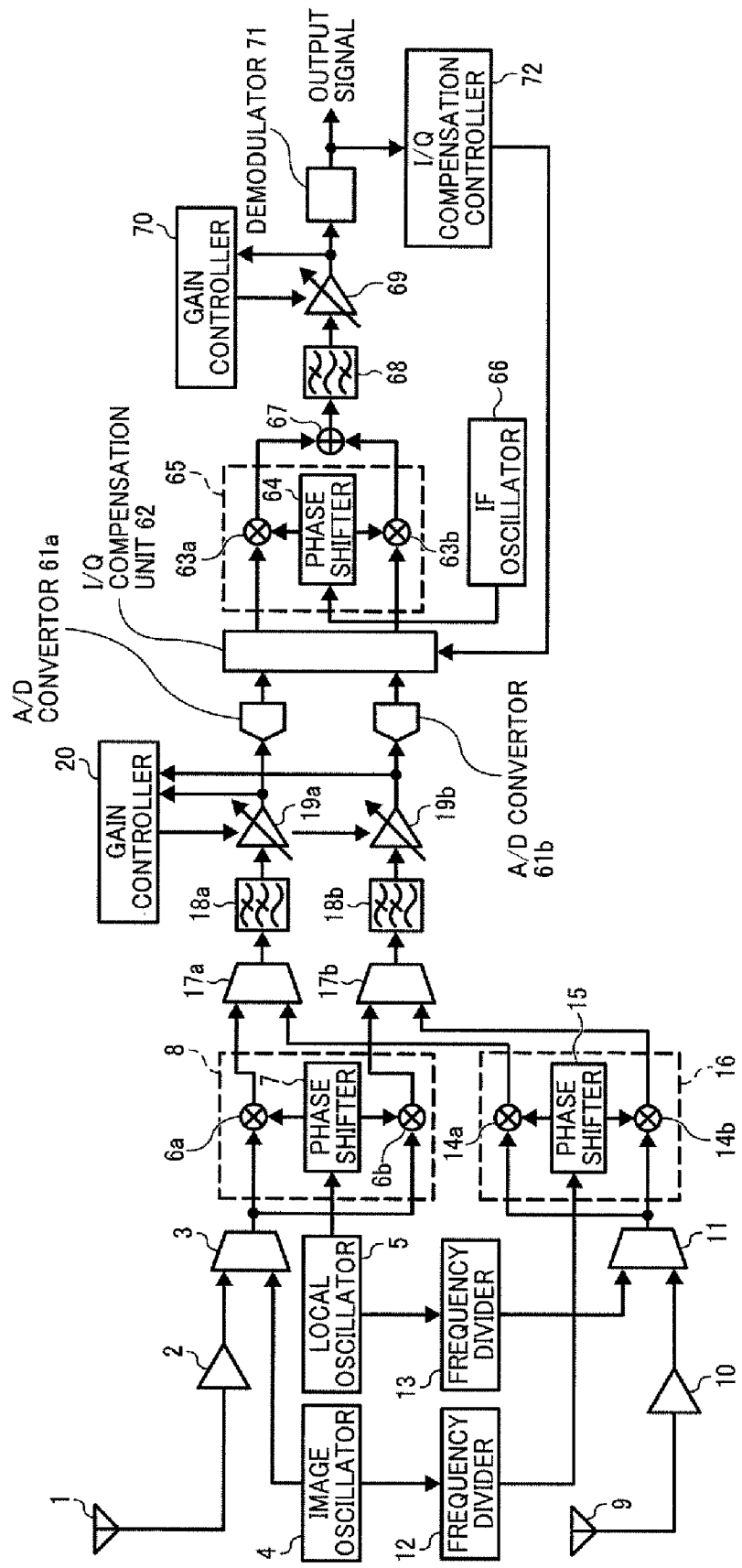
FIG. 5 is a circuit diagram of another FM-AM demodulator according to an illustrative second embodiment.

FIG. 1 is a circuit diagram of an FM-AM receiver that includes an FM-AM demodulator according to an illustrative first embodiment. FIG. 2 is a schematic for explaining how the image affects the receiving signal. FIG. 3 is a Weaver method circuit that removes the image signal. FIG. 4 is a circuit diagram of I/Q compensation unit of the FM-AM demodulator of FIG. 1. FIG. 5 is a circuit diagram of another FM-AM demodulator according to an illustrative second embodiment.

The FM-AM receiver shown in FIG. 1 according to the first embodiment that receives FM and AM signals includes a FM-AM demodulator. The FM-AM demodulator demodulates the received signal using the super-heterodyne method. The FM-AM demodulator includes a FM signal amplifier 2, a first selector 3, an image oscillator 4, a local oscillator 5, and a first orthogonal mixer 8. The FM signal amplifier 2 amplifies the FM signal input from a FM antenna 1. The local oscillator 5 generates a local signal used for converting FM signal to a signal having an intermediate frequency. The image oscillator 4 generates an image signal having FM frequency band. The selector 3 selects a signal among the signal from the FM signal amplifier 2 and the signal from the image oscillator 4, and outputs it. The first orthogonal mixer 8 generates an I signal and a Q signal that are mutually orthogonal, by performing frequency conversion using the signal selected by the selector 3 and the local signal generated by the local oscillator 5.

Further, the FM-AM demodulator includes an AM signal amplifier 10, a first frequency divider 12, a second frequency divider 13, a second selector 11, and a second orthogonal mixer 16. The AM signal amplifier 10 amplifies the AM signal input from an AM antenna 9. The first frequency divider 12 generates a local signal used for converting AM signal to a signal having an intermediate frequency. The second frequency 13 divides the frequency of the output signal from the local oscillator 5. The second selector 11 selects a signal among the signal from the AM signal amplifier 10 and the signal from the second frequency divider 13, and outputs it. The orthogonal mixer 16 generates an I signal and a Q signal that are mutually orthogonal, by performing frequency conversion using the signal selected by the second selector 11 and the signal from the first frequency divider 12.

Further, the FM-AM demodulator includes a third selector 17a, a first filter 18a, a first amplifier 19a, a fourth selector 17b, a second filter 18b, a second amplifier 19b, and a first gain controller 20. The third selector 17a selects a signal among the I signal from the first orthogonal mixer Band the I signal from the second orthogonal mixer 16, and outputs it.

The first filter 18a removes high-frequency wave from the I signal that is selected and output by the selector 17a, and outputs it. The first amplifier 19a amplifies the I signal output from the first filter 18a.

The fourth selector 17b selects a signal among the Q signal from the first orthogonal mixer 8 and the Q signal from the second orthogonal mixer 16. The second filter 18b removes high-frequency wave from the Q signal that is selected and output by the selector 17a, and outputs it. The second amplifier 19b amplifies the Q signal output from the second filter 18b.

The first gain controller 20 receives the I signal output from the first amplifier 19a and the Q signal output from the second amplifier 19b, and controls the first and second amplifiers 19a and 19b so that the I signal and the Q signal to have a predetermined amplitude, respectively.

Further, the FM-AM demodulator includes an I/Q compensation unit 21, an IF oscillator 25, a third orthogonal mixer 24, an adder 26, a channel filter 27, a third amplifier 28, a second gain controller 29, a gain demodulator 30, and an I/Q compensation controller 31.

The I/Q compensation unit 21 adjusts phase and gain on one of the I signal from the amplifier 19a and the Q signal from the amplifier 19b, or the phase and the gain on both of the I and Q signals. When the FM signal having an intermediate frequency converted from the FM signal received through the FM antenna 1 is demodulated, and when the AM signal having an intermediate frequency converted from the AM signal received through the AM antenna 9 is demodulated, the IF oscillator 25 generates a signal having a predetermined frequency and outputs it.

The third orthogonal mixer 24 generates and outputs an I signal and a Q signal frequency-converted using the I signal and Q signal output from the I/Q compensation unit 21 and the signal output from the IF oscillator 25. The adder 26 adds the frequency-converted I signal and Q signal output from the third orthogonal mixer 24, and outputs it. The channel filter 27 extracts a signal having a predetermined frequency band from the output signal from the adder 26.

The third amplifier 28 amplifies the output signal from the channel filter 27, and outputs it. The second gain controller 29 makes an amplitude of the output signal from the third amplifier 28 to a predetermined amplitude. The demodulator 30 demodulates the output signal from the third amplifier 28, and outputs it. The I/Q compensation controller 31 detects the amplitude of the output signal from the demodulator 30, and generates an I/Q compensation signal and outputs it to the I/Q compensation unit 21 to adjust phase and gain of the I and Q signals in the I/Q compensation unit 21.

The first orthogonal mixer 8 includes mixers 6a and 6b and a phase shifter 7. The second orthogonal mixer 16 includes mixers 14a and 14b and a phase shifter 15. The third orthogonal mixer 24 includes mixers 22a and 22b and a phase shifter 23.

Operation of the FM-AM demodulator will be described.

The FM signal amplifier 2 amplifies the FM signal that the FM antenna 1 receives. The selector 3 selects the output signal of the FM signal amplifier 2 or the output signal of the image oscillator 4 and outputs it.

The local oscillator 5 generates a signal fit for a channel to be received, and outputs the signal to the phase shifter 7. The phase shifter 7 generates signals which have phase a difference of 90 degrees based on the local oscillation signal, and outputs the signals to the mixers 6a and 6b. Further, the local oscillator 5 may generate the signals which have a phase difference of 90 degrees r and input them directly to the mixers 6a and 6b.

The mixers 6a and 6b multiplies the output signal from the selector 3 and the output signal from the phase shifter 7, and outputs them as the I signal and the Q signal, respectively. Thus, the first orthogonal mixer 8 is formed by the mixers 6a and 6b and the phase shifter 7.

Similarly, the AM signal amplifier 10 amplifies the AM signal that the AM antenna 9 receives, and outputs it to the selector 11.

The first and second frequency dividers 12 and 13 divide the frequency of the output signal of the local oscillator 5 and the image oscillator 4 with a predetermined dividing ratio, respectively.

The selector 11 selects either the signal from the AM signal amplifier 10 or the signal from the second frequency divider 13, and outputs it to the mixers 14a and 14b. The output signal of the first frequency divider 12 is input to the phase shifter 15. Similarly to the first orthogonal mixer 8, the first orthogonal mixer 16 is formed by the mixers 14a and 14b and the phase shifter 15.

The selector 17a selects between the I output signals from the orthogonal mixers 8 and 16 and outputs it. Further, the selector 17b selects between the Q output signals from the orthogonal mixers 8 and 16 and outputs it.

The first filter 18a removes unnecessary signal from the selected I signal, and the first amplifier 19a amplifies the output signal from the first filter 18a. Similarly, the first filter 18b removes unnecessary signal from the Q signal selected by the selector 17b and the second amplifier 19b amplifies the output signal.

The first gain controller 20 generates a control signal based on the output signals from the amplifiers 19a and 19b and controls gain of the amplifiers 19a and 19b to obtain output signals having a predetermined amplitude.

The I/Q compensation unit 21 performs correction on the amplitude and the phase on one or both of the I signal and Q signal using the control signal from the I/Q compensation controller 31, and outputs it.

The IF oscillator 25 generates a signal having a predetermined intermediate frequency and outputs it to the phase shifter 23. Instead of using the IF oscillator 25, a signal may be selected from the output signals from the local oscillator 5 and the image oscillator 4, and frequency of the selected signal is divided to a predetermined frequency to input to the phase shifter 23.

The phase shifter 23 generates signals which have a phase difference of 90 degrees from each other from the input signal having a intermediate frequency for output to the mixers 22a and 22b. Thus, the mixers 22a and 22b and the phase shifter 23 also form an orthogonal mixer 24.

The mixers 22a and 22b multiply the I signal and the Q signal output from the I/Q compensation unit 21 with the output signal from the phase shifter 23, and outputs it. The adder 26 adds the I signal output from the orthogonal mixer 24 to the Q signal output from the orthogonal mixer 24, and outputs it.

The channel filter 27 extracts a signal having a desired frequency band from the output signal of the adder 26. The extracted signal is then amplified by the third amplifier 28 and input to the demodulator 30.

The gain controller 29 generates a control signal based on the output signal from the third amplifier 28 to control the third amplifier 28 to obtain a predetermined signal.

The demodulator 30 demodulates the input signal with a predetermined demodulation method, and outputs it. The output signal from the demodulator 30 is output as an audio signal through, for example, a speaker, not shown.

The I/Q compensation controller 31 generates an I/Q compensation control signal based on the output signal and outputs it to the I/Q compensation unit 21.

The FM-AM demodulator shown in FIG. 1 selects a FM signal or an AM signal using the selectors 17a and 17b. After selection, the same circuits are used to process the signal in the following stages. Alternatively, however, other circuits having different circuit configurations for the FM and AM signals may be employed to demodulate the FM signal and the AM signal, respectively.

As explained in the background section, generation of the image signal becomes a problem when the demodulation is performed using the super-heterodyne method.

Where the first local oscillation signal frequency is $\omega 1$, and the second local oscillation signal frequency is $\omega 2$, a frequency of the desired signal is $(\omega 1 + \omega 2)$.

At the mixer, the desired signal is down-converted to a signal having the frequency $\omega 2$, however, an image signal having the image frequency signal $(\omega 1 - \omega 2)$ is also down-converted to a signal having the frequency $-\omega 2$. Accordingly, during the demodulation, the image signal overlaps the desired signal. This is the image signal problem. FIG. 2 is an explanatory schematic for explaining the effect of the image signal.

In the Low-IF technology in particular, a value of the intermediate frequency $\omega 2$ is extremely small compared to the first local oscillation frequency $\omega 1$. Accordingly, it is difficult to remove the image signal in advance by, for example, filtering.

For solving such a problem, the Weaver method is well known as a technology to remove the image signal. FIG. 3 is an explanatory schematic diagram to explain the Weaver method. Similarly to the configuration shown in FIG. 1, an orthogonal mixer 42 is formed by inputting signals which have a phase difference of 90 degrees to mixers 40a and 40b from a local oscillator 41. Similarly, an orthogonal mixer 46 is formed by a local oscillator 46 and mixers 44a and 44b.

An input signal is input to the first orthogonal mixer 42 to perform frequency conversion, and the I signal and the Q signal are output. High frequency elements are removed from the I signal and the Q signal by filters 43a and 43b, and are input to the second orthogonal mixer 46. Then, the output signals are added by an adder 47.

As shown in FIG. 3, the input signal and the local oscillation signals of the first and second orthogonal mixers 42 and 46 are expressed as $\sin(\omega 0 * t)$, $\sin(\omega 1 * t)$, $\cos(\omega 1 * t)$, $\sin(\omega 2 * t)$, $\cos(\omega 2 * t)$, respectively, where "*" means multiplication.

The I output signal from the first orthogonal mixer 42 is expressed as formula (1)

$$\sin(\omega 0 * t) * \sin(\omega 1 * t) = -(1/2) * (\cos(\omega 0 + \omega 1) * t - \cos(\omega 0 - \omega 1) * t) \quad (1)$$

Since high-frequency elements are removed by the filter 43a, the output signal of the filter 43a is expressed as $$A(t) = (1/2)\cos(\omega 0 - \omega 1) * t$$

Similarly, the output signal of the filter 43b is expressed as $$B(t) = (1/2)\sin(\omega 0 - \omega 1) * t$$

Similarly, the I output signal from the second orthogonal mixer 46 is expressed as formula (2)

$$C(t) = (1/4)\sin((\omega 0 - \omega 1) + \omega 2) * t) - \sin((\omega 0 - \omega 2) * t) \quad (2)$$

The signal at the Q output is expressed as formula (3)

$$D(t) = (1/4) * \sin((\omega 0 - \omega 1) + \omega 2) * t) - \sin((\omega 0 - \omega 1) - \omega 2) * t) \quad (3)$$

Accordingly, the output signal of the adder 47 is expressed as formula (4)

$$-C(t) + D(t) = (1/2) * \sin(\omega 0 - \omega 1 - \omega 2) \quad (4)$$

If $\omega 0 \ll \omega 2$, a signal element having a desired frequency band (around $(\omega 1 + \omega 2)$) shown in FIG. 2 is output. It is found that a signal element having image frequency band (around $(\omega 1 - \omega 2)$) is canceled.

However, in the Weaver method, when amplitude error or phase error arises between the I signal and the Q signal generated during demodulation process, image signal elements may not be sufficiently removed.

In the example shown in FIG. 3, it will be shown that there are gain error "r" and phase error "ψ" in the local oscillation signal input to the first orthogonal mixer 42.

When the errors are considered, the formula previously described for the local oscillation signal can be expressed as $$r * \sin(\omega 1 * t + \psi), \cos(\omega * t)$$

Then, the I output signal from the first orthogonal mixer 42 is expressed as formula (5)

$$\sin(\omega 0 * t) * r * \sin(\omega 1 * t + \psi) = -(r/2) * \cos((\omega 0 + \omega 1) * t + \psi) - \cos((\omega 0 - \omega 1) * t - \psi) \quad (5)$$

High frequency element is removed by the filter 43a and the signal is expressed as $$A(t) = (r/2)\cos((\omega 0 - \omega 1) * t - \psi)$$

The Q output signal from the first orthogonal mixer 42 and the output signal B(t) from the filter 43b are the same as in the example described above. Accordingly, the I output signal from the second orthogonal mixer 46 is expressed as formula (6) and the Q output signal is expressed as formula (7)

$$C(t) = (r/4)\sin((\omega 0 - \omega 1) + \omega 2) * t - \psi) - \sin((\omega 0 - \omega 1 - \omega 2) * t - \psi) \quad (6)$$

$$(7) \quad D(t) = (1/4) * \sin((\omega 0 - \omega 1) + \omega 2) * t) + \sin((\omega 0 - \omega 1) - \omega 2) * t)$$

As described above, the image signal e(t), which is a residual image signal due to the gain error and the phase error while outputting by the adder 47, is expressed as formula (8). An image removal ratio is approximated as $$(((1-r) * \psi *)/2)$$

$$e(t) = -(r/4)\sin((\omega 0 - \omega 1) + \omega 2) * t - \psi) + (1/4) * \sin((\omega 0 - \omega 1) + \omega 2) * t) = ((1-r) * \psi)/4 * \cos((\omega 0 - \omega 1) + \omega 2) * t) \quad (8)$$

For removing the image signal, the removal ratio should be around −50 dB. Accordingly, acceptable error range of the gain and phase is extremely small in the Weaver method.

However, even with careful circuit design and layout design, error between the I and Q signals is not avoidable due to variation in the relative characteristics between the transistors. Accordingly, it is necessary to remove error by providing a predetermined compensation on the amplitude and the phase for one or both of the I and Q signals.

In the FM-AM demodulator shown in FIG. 1, compensation for error between the I and Q signals will be described, using as an example reception of an FM signal.

Referring to FIG. 1, when the FM signal is received, the selectors 17a and 17b select an output signal from the first orthogonal mixer 8, respectively.

Normally, the selector 3 selects the output signal from the FM amplifier 2. However, in the image-compensation-adjustment operation, the selector 3 selects the output signal from the image oscillator 4 and inputs the selected signal to the orthogonal mixer 8.

The local oscillator 5 inputs a signal having the local oscillation frequency suitable for a desired channel to be received to the first orthogonal mixer 8. The image oscillator 4 outputs a signal having a predetermined image signal frequency to the selector 3.

When the selector 3 selects the signal output from the image oscillator 4 at the image-compensation-adjustment operation, the first orthogonal mixer 8 outputs a signal having a frequency that is a multiple of the image signal frequency and the local oscillation signal frequency.

For the signal from the first orthogonal mixer 8, the filters 18a and 18b, the amplifiers 19a and 19b, and the first gain controller 20 performs a predetermined normal operation. As a result, the amplitude of the output signals from the amplifiers 19a and 19b becomes a predetermined amplitude by removing unnecessary signal.

As for the image signal, the amplitude of the output signals from the amplifiers 28 will be changed by the I/Q compensation unit 21. Accordingly, the gain of the amplifiers 28 must be fixed without performing the control operation by the second gain controller 29.

The I/Q compensation unit 21 performs compensation operation on the gain and the phase of the I signal or Q signal or both of the I/Q signals based on the compensation signal input from the I/Q compensation controller 31.

FIG. 4 is an example circuit that performs compensation on the phase and gain in the I/Q compensation unit 21.

In FIG. 4, it is assumed that "in +", "in −" are a pair of differential signals. Further, variable resisters 51a and 51b have an equal resistance R1, and variable resisters 52a and 52b have another equal resistance R2. Capacitors 53a and 53b have an equal capacitance C. The differential amplifier 54 has a wide operational band and sufficient gain for the operation.

A transfer function H(s) of this circuit is expressed as formula (9)

$$H(s) = (R2/R1) * (1/(1 + R2 * C * s)) \quad (9)$$

Accordingly, in the circuit shown in FIG. 4, it is possible to adjust the phase delay of the output signals out+ and out− by changing the resistance R2 of the resistors 52a and 52b to obtain a desired delay.

When the resistance R2 of the resistors 52a and 52b is changed, the gain is also changed. However, when the resistance R1 of the resistors 51a and 51b is changed after fixing phase delay, it is possible to obtain a desired gain.

In the circuit of the I/Q compensation unit 21 shown in FIG. 4, when the resistances R1 and R2 are fixed for one of the I and Q signals, the resistances R1 and R2 are varied for another one of the I and Q signals. Consequently, it is possible to control so as to remove error between the I and Q signals by changing the phase delay and gain of the I and Q signals.

It is to be noted that, in the example circuit shown in FIG. 4, capacitance C of the capacitor 53a and 53b may be changed instead of changing the resistance R2 of the resistors 52a and 52b.

According to the formula (8), it is found that absolute value of the residual image signal of both I and Q signals due to the error between the I and Q signals is a downwardly convex function.

Accordingly, in the FM-AM demodulator shown in FIG. 1, it is possible to perform the best I/Q compensation correction by inputting a control signal generated by the I/Q compensation controller 31 to the compensation unit 21. The control signal is generated so that the output signal from the demodulator 30 is minimized under a condition in which the selector 3 selects the output signal of the image oscillator 4.

In the example expressed by formula (5), error for the first orthogonal mixer 8 is described. The formula (8) can be applied to the gain error and the phase error generated in paths of the local oscillation signal input to the second orthogonal mixer 16, the I and the Q signals. Accordingly, it is possible to eliminate error between the I and Q signals using the above-described method.

Further, as for an I/Q compensation when the AM signal is received, the similar compensation operation described above for the FM signal can be applied.

More specifically, in FIG. 1, the selector 11 is set to output a signal from the frequency divider 13 and the selectors 17a and 17b output the signals from the orthogonal mixer 16. Further, the frequencies of signals output from the frequency dividers 12 and 13 are set equal to the local oscillation frequency and the image frequency, respectively.

Under these conditions, the I/Q compensation controller 31 generates an I/Q compensation control signal for inputting to the I/Q compensation unit 21 so that the output signal from the demodulator 30 becomes the minimum value. As a result, it becomes possible to remove image elements accurately.

Generally, noise current ratio in the transistor current is inversely proportional to the square root of the transistor current. Therefore, it is inevitable that consumption current increases to achieve a low noise circuit.

Further, in general with wireless receivers (radio receivers), the noise characteristic of the local oscillator 5 seriously affect reception. Accordingly, it is requested to generate local signal having a predetermined frequency with great accuracy. Accordingly, it is also requested to minimize phase noise of the local oscillator 5. As a result, power consumption of the local oscillator 5 accounts for a large portion of the total power consumption of the receiver.

However, signal frequency band of the AM broadcast is extremely low, i.e., 1/40, compared to the signal frequency band of the FM broadcast. Accordingly, requirement for a low noise in phase can be greatly relaxed for the local oscillator 5 for the AM broadcast compared to the FM broadcast.

It is to be noted that in the image compensation adjustment operation described above, the image signal is suppressed just in the frequency band. Accordingly, it is acceptable that the image signal includes noise to some extent. More specifically, in the FM-AM demodulator shown in FIG. 1, it is possible to relax the requirement on the noise performance for the image oscillator 4 compared to the local oscillator 5. Accordingly, the power consumption of the image oscillator 4 can be made lower than the power consumption of the local oscillator 5.

When the AM signal is received, the first frequency divider 12 divides the frequency of the signal output from the image oscillator 4 by a predetermined frequency to generate an AM local oscillation signal. In this case, the local oscillator 5 is put in sleep mode so that it is possible to reduce the power consumption. Further, it is not necessary to employ the local oscillator 5 dedicated to the AM broadcast, resulting in chip size reduction.

In the image-compensation-adjustment operation for the AM signal, the frequency divider 13 may generate a predetermined frequency from the output signal from the local oscillator 5 to generate an AM image signal. The power consumption in this case is equal to the power consumption when the FM signal is received. However, the image signal is needed only at the image-compensation-adjustment operation, and is not necessary at the normal receiving operation. Accordingly, power consumption by this adjustment operation does not affect power consumption at the normal receiving operation.

It is preferable to use the Phase Lock Loop (PLL) circuit for the local oscillator 5, the image oscillator 4, and the IF oscillator 25. Since the PLL circuit is well known, a description of the operation of the PLL circuit is omitted.

As described, the FM-AM receiver shown in FIG. 1 that includes the FM-AM demodulator can receive FM and AM broadcasts by switching FM and AM signals using the superheterodyne method, and includes a compensation circuit that compensates the gain error and the phase error of the I signal and the Q signal with the Weaver method to remove image signal, resulting in achievement of high performance demodulation having a high image removal ratio.

Further, the FM-AM receiver includes two different kinds of oscillator, i.e., the local oscillator 5 and the image oscillator 4. When the FM broadcast is received, the local oscillator 5 which has a high noise performance generates the local oscillation signal, and when the AM broadcast is received, the image oscillator 4 which has a low noise performance generates the local oscillation signal. Consequently, it is possible to lower the power consumption when the AM broadcast is received.

For adjusting the compensation circuit to remove image signal, the image frequency signal is generated by the oscillator which is not used to generate the local signal for the FM or the AM broadcast. Accordingly, it is not necessary to have a special oscillator to generate the image signal, resulting in chip size reduction.

Referring to FIG. 5, another example embodiment according to the present invention will be described.

The FM-AM receiver shown in FIG. 5 that includes the FM-AM demodulator employs A/D converters 61a and 61b in the former stage of the I/Q compensation unit 21 additionally to the FM-AM receiver shown in FIG. 1. Further, later-stage circuits after the A/D converters are digital circuits.

The I signal and the Q signal that are digitalized by the A/D converters 61a and 61b are input to the I/Q compensation unit 62, respectively. The I/Q compensation unit 62 compensates the gain error and the phase error with digital processing.

The following circuits after the I/Q compensation unit are an IF oscillator 66, a phase shifter 64, digital mixers 63a and 63b, an adder 67, a digital filter 68, amplifier 69, and a demodulator 70, and are digital circuits each of which performs similarly to the respective circuit employed in the example embodiment shown in FIG. 1.

The pre-stage circuits before the A/D converters 61a and 61b are the same circuits as the circuits in the FM-AM receiver shown in FIG. 1 that includes the FM-AM demodulator. Accordingly, a description of the operation of the circuits is omitted.

The I/Q compensation unit 62 performs compensation operation on the gain and the phase of the I signal or Q signal or both of the I and Q signals. The compensation operation is performed with digital processing, and may be easily achieved by employing a general digital filter.

The IF oscillator 66 holds phase information inside, and increments the phase information at each clock of a reference clock. Further, the IF oscillator 66 stores a value that corresponds to the phase information and outputs it when it is needed to generate the IF signal.

The phase shifter 64 is a digital filter which generates signals which have a phase difference of 90 degrees based on the IF signal, and outputs them to the digital mixers 63a and 63b. Further, the IF oscillator 66 may store two different values which have a phase difference of 90 degrees and output them directly to the digital mixers 63a and 63b.

The digital mixers 63a and 63b multiplies the output signal from the I/Q compensation unit 62 and the output signal from the phase shifter 64. Thus, the phase shifter 64, and the digital mixers 63a and 63b form the orthogonal mixer 65.

The adder 67 adds the output signals of the orthogonal mixer 65 and outputs. The digital filter 68 extracts a signal having a necessary frequency band from the output signal of the adder 67. The amplifier 69 amplifies the input signal by a setting gain and outputs it.

The first gain controller 70 controls a gain of the amplifier 69 to obtain output signal to have a predetermined amplitude. The demodulator 71 demodulates the input signal with a predetermined demodulation method based on the output signal of the amplifier 69. These signal processes are performed digitally. Accordingly, the signal is treated losslessly except an error due to quantization, resulting in achievement of high performance demodulation with high accuracy.

As previously described, in "Low-IF" technology, the intermediate frequency is set to the relatively lower frequency band such as a few hundred kHz. Accordingly, a frequency band for the A/D converters 61a and 61b shown in FIG. 5 can be set to low. Generally, when the frequency band to be handled is low, the A/D converters 61a and 61b can perform accurate processing so that it becomes possible to achieve high performance demodulation with high accuracy.

Further, as for the demodulation unit that follows the A/D converters 61a and 61b and is formed by the orthogonal mixer 65, the IF oscillator 66, the adder 67, the filter 68, the amplifier 69 and the demodulator 71, the demodulation unit performs signal processing digitally. Accordingly, it is possible to avoid errors due to, for example, nonlinearity. Consequently, high performance demodulation with high accuracy can be easily achieved To generate a reference clock for operation of the digital units, one of the signals of the local oscillator 5 and the image oscillator 4 is selected, and the selected signal is divided to a signal having a desired frequency to use it as the reference clock. Taking this approach, chip size reduction will be achieved.

As described above, in the FM-AM receiver shown in FIG. 5 that includes the FM-AM demodulator can receive FM and AM broadcasts by switching FM and AM signals using the super-heterodyne method, and includes compensation circuit that compensates the gain error and the phase error of the I signal and the Q signal with the Weaver method to remove image signal, resulting in achievement of high performance demodulation having high image removal ratio.

Especially, signal is converted using the A/D converters 61a and 61b in the intermediate frequency band, and signal processing is performed digitally in the following circuits after the A/D converters 61a and 61b. Accordingly, the processed signal is not affected by noise, resulting in achievement of high performance demodulation with high accuracy.

Further, the FM-AM receiver includes two different kinds of oscillators, i.e., the local oscillator 5 and the image oscillator 4. When the FM broadcast is received, the local oscillator 5 which has a high noise performance generates the local oscillation signal, and when the AM broadcast is received, the image oscillator 4 which has a low noise performance generates the local oscillation signal. Consequently, it is possible to lower the power consumption when the AM broadcast is received.

The image frequency signal for removing image signal is generated by the oscillator which is not used to generate the local signal for FM or AM broadcast, it is not necessary to have a special oscillator to generate the image signal, resulting in chip size reduction.

As described above, in the FM-AM receiver shown in FIG. 1 that includes the FM-AM demodulator using the super-heterodyne method includes an image removal circuit with the Weaver method to remove image signal, a compensation circuit that compensates the errors between the I signal and the Q signal, and an image signal oscillator to detect a compensation value. When the AM broadcast in which low noise performance is requested, the image oscillator may be used as a replacement of the local oscillator, resulting in power consumption reduction.

When, the local oscillator 5 is used to generate image oscillation signal for the AM broadcast, it is possible to achieve chip size reduction.

In the FM-AM receiver shown in FIG. 5, the receiving signal is converted to a signal having intermediate frequency and is processed digitally. Accordingly, the processed signal is not affected by noise, resulting in achievement of high performance demodulation with high accuracy.

The Weaver method has a advantage at the demodulation under the "Low-IF" technology. Setting "Low-IF", the frequency band for the A/D converter can be set low. Accordingly, it is possible to achieve high performance A/D converter, resulting in achievement of high performance demodulation with high accuracy.

Processing operation performed in the FM-AM receiver shown in FIGS. 1 and 5 that include the FM-AM demodulator including an operation of image signal compensation will be described.

When the image-compensation-adjustment operation is performed in the FM-AM demodulator shown in FIG. 1

1) When the image-compensation-adjustment operation for the FM signal is performed, (1-1) the selector 3 is set to select the output signal from the image oscillator 4, and the selector 3 inputs the selected signal to the orthogonal mixer 8. The I signal and Q signal are generated by multiplying the image signal frequency and the local oscillation signal frequency at the first orthogonal mixer 8. The first orthogonal mixer 8 outputs an I signal to the selector 17a and the Q signal to the selector 17b.

(1-2) The selector 17a is set to select the I signal output from the orthogonal mixer 8. The I signal is input to the I/Q compensation unit 21 through the filter 18a and the amplifier 19a. The selector 17b is set to select the Q signal output from the orthogonal mixer 8. The Q signal is input to the I/Q compensation unit 21 through the filter 18b and the amplifier 19b.

(1-3) The gain controller 29 is set to make the third amplifier 28 to have a fixed gain. The adder 26 adds the I signal to the Q signal generated by multiplying the I and the Q signals output from the I/O compensation unit 21 to the local oscillation signal frequency output from the IF oscillator at the orthogonal mixer 24. The output signal through the filter 27 is amplified by the amplifier 28 and input to the demodulator 30.

(1-4) The I/Q compensation controller 31 generates a compensation signal and input it to the I/Q compensation unit 21 to adjust phase and gain on one or both of the I and Q signals in the I/Q compensation unit 21 in accordance with the compensation signal so that the output signal becomes minimum value.

(1-5) When the FM signal is demodulated, the selector 3 is set to select the signal output from the amplifier 2, and the selector 3 inputs the signal from the amplifier 2 to the orthogonal mixer 8. After that, at a setting similar to the setting performed in the image-compensation-adjustment operation, it is canceled to fix the gain of the amplifier 28 caused by the gain controller 29. Further, the I/Q compensation controller 31 inputs the compensation signal that is generated at the image-compensation-adjustment operation for the FM signal.

2) When the image-compensation-adjustment operation for the AM signal is performed, (2-1) The selector 11 is set to select the output signal from the frequency divider 13, and the selector 11 inputs the selected signal to the orthogonal mixer 16. The I signal and Q signal are generated by multiplying the image signal frequency from the frequency divider 13 and the local oscillation signal frequency from the frequency divider 12 at the orthogonal mixer 16. The orthogonal mixer 16 outputs an I signal to the selector 17a and the Q signal to the selector 17b.

(2-2) The selector 17a is set to select the I signal output from the orthogonal mixer 16. The I signal is input to the I/Q compensation unit 21 through the filter 18a and the amplifier 19a. The selector 17b is set to select the Q signal output from the orthogonal mixer 16. The Q signal is input to the I/Q compensation unit 21 through the filter 18b and the amplifier 19b.

(2-3) After that, similarly to the image-compensation-adjustment operation for the FM signal, The I/Q compensation unit 21 performs correction on the gain and the phase on one or both of the I signal and Q signal in accordance with the compensation signal from the I/Q compensation controller 31.

(2-4) When the AM signal is demodulated, the selector 11 is set to select the signal output from the amplifier 10, and the selector 11 inputs the signal from the amplifier 10 to the orthogonal mixer 16. After that, at a setting similar to the setting performed in the image-compensation-adjustment operation, it is canceled to fix the gain of the amplifier 28 caused by the gain controller 29. Further, the I/Q compensation controller 31 inputs the compensation signal that is generated at the image-compensation-adjustment operation for the AM signal.

When the AM signal is demodulated, it is possible to reduce the power consumption by setting the local oscillator 5 in sleep mode.

The above-described embodiments are illustrative and do not limit the present invention. Thus, numerous additional modifications and variations are possible in light of the above teachings. For example, in the FM-AM receiver shown in FIG. 5 that includes the FM-AM demodulator, a DA converter may be provided in following stage after the demodulator 71 to perform processing with analog signal. Further, features of components of the embodiments, such as the number, the position, and the shape, are not limited the embodiments and thus may be set as preferred. It is therefore to be understood that, within the scope of the appended claims, the disclosure of this patent specification may be practiced otherwise than as specifically described herein.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-024945 filed on Feb. 5, 2009 in the Japanese Patent Office, the entire contents of which are incorporated by reference herein.

What is claimed is:

1. An FM-AM demodulator comprising:
    an FM signal amplifier configured to amplify an input FM signal;
    a local oscillator configured to generate a local oscillation signal for converting the FM signal to an intermediate frequency signal;
    an image oscillator configured to generate an image signal in FM frequency band;
    a first selector configured to select one of a signal from the FM signal amplifier and a signal from the image oscillator to output;
    a first orthogonal mixer configured to generate and output an I signal and a Q signal by performing frequency conversion using the local oscillation signal generated by the local oscillator and the signal selected by the first selector;
    an AM signal amplifier configured to amplify an input AM signal;
    a first frequency divider configured to generate a local oscillation signal for converting the AM signal to an intermediate frequency signal by performing frequency division on the output signal from the image oscillator;
    a second frequency divider configured to perform frequency division on the output signal from the local oscillator;
    a second selector configured to select one of a signal from the AM signal amplifier and a signal a signal from the second frequency divider to output;
    a second orthogonal mixer configured to generate and output I signal and Q signal by performing frequency conversion using the signal selected by the second selector and a signal from the first orthogonal mixer;
    a third selector configured to select one of the I signal from the first orthogonal mixer and the I signal from the second orthogonal mixer to output;
    a first filter configured to remove a high frequency signal component from the I signal selected by the third selector and output it;
    a first amplifier configured to amplify the I signal output from the first filter;
    a fourth selector configured to select one of the Q signal from the first orthogonal mixer and the Q signal from the second orthogonal mixer to output;
    a second filter configured to remove a high frequency signal component from the Q signal selected by the fourth selector to output it;
    a second amplifier configured to amplify the Q signal output from the second filter;

a first gain controller configured to receive the I signal the first amplifier outputs and the Q signal the second amplifier outputs, and control the first and the second amplifiers so that the input I signal and the input Q signal have predetermined amplitudes;

an I/Q compensation unit configured to perform a compensation operation on the gain and the phase of the I signal from the first amplifier or the Q signal from the second amplifier or both of the I and Q signals and output;

an IF oscillator configured to generate and output a signal having a predetermined frequency when the intermediate frequency signal for the FM received signal or AM received signal is demodulated;

a third orthogonal mixer configured to generate and output an I signal and a Q signal by performing frequency conversion using the I and Q signals output from the I/Q compensation unit with a signal output from the IF oscillator;

an adder configured to add the converted I and Q signals output from the third orthogonal mixer to output;

a channel filter configured to extract a signal with a predetermined frequency band from the signal output from the adder;

a third amplifier configured to amplify the signal output from the channel filter to output;

a second gain controller configured to control the third amplifier to output a signal having a predetermined amplitude;

a demodulator configured to generate and output an output signal by demodulating the output signal from the third amplifier; and an I/Q compensation controller configured to generate an I/Q compensation signal to be used for adjusting phase and gain of the I signal in the I/Q compensation unit by detecting the amplitude of the output signal from the demodulator, and output the generated signal to the I/Q compensation unit.

2. The FM-AM demodulator of claim 1, further comprising:

a first A/D converter configured to receive the I signal output from the first amplifier and convert the input signal to a digital signal; and a second A/D converter configured to receive the Q signal output from the second amplifier and convert the input signal to a digital signal, wherein an I/Q compensation unit, an IF oscillator, a third orthogonal mixers, an adder, a channel filter, the third amplifier, a demodulator, and a I/Q compensation controller are digital circuits.

3. The FM-AM demodulator of claim 1, wherein the image oscillator has low phase noise characteristics compared to the local oscillator.

4. An FM-AM demodulator of claim 1, wherein the image oscillator, which has low noise performance, generates the local oscillation signal when an AM broadcast is received.

5. An FM-AM receiver employing the FM-AM demodulator of claim 1, comprising an FM antenna and an AM antenna, wherein the FM-AM receiver demodulates the FM signal input from the FM antenna and the AM signal input from the AM antenna using the FM-AM demodulator.

6. An electronic equipment which employs the FM-AM demodulator of claim 1.

7. A control method of performing image compensation adjustment of an FM signal for an FM-AM demodulator, comprising the steps of:

setting a first selector to select a output signal from an image oscillator;

inputting the selected signal to a first orthogonal mixer;

outputting an I signal to a third selector and a Q signal to a fourth selector, the I signal and Q signal generated by multiplying an image signal frequency from the image oscillator and a local oscillation signal frequency from a local oscillator at a first orthogonal mixer;

setting a third selector to select the I signal output from the first orthogonal mixer;

inputting the I signal output from the first orthogonal mixer to an I/Q compensation unit through a first filter and a first amplifier;

setting a fourth selector to select the Q signal output from the first orthogonal mixer;

inputting the Q signal output from the first orthogonal mixer to the I/Q compensation unit through a second filter and a second amplifier;

setting a gain controller to give a third amplifier a fixed gain;

adding the I signal to the Q signal, the I signal and the Q signal generated by multiplying the I and the Q signals output from the I/Q compensation unit by the local oscillation signal frequency output from the IF oscillator at the third orthogonal mixer;

inputting added signal to a channel filter;

amplifying an output signal through the channel filter;

inputting the output signal from the amplifier to a demodulator;

generating a compensation signal so as to make the output signal from the demodulator a minimum value;

inputting the compensation signal to the I/Q compensation unit; and adjusting phase and gain on one of the I and Q signals or both of the I and Q signals in the I/Q compensation unit in accordance with the compensation signal.

8. The control method of claim 7, wherein, when the FM signal is demodulated, further comprising the steps of:

setting the first selector to select the signal output from the FM amplifier;

inputting the signal from the FM amplifier to the first orthogonal mixer;

canceling the fixed gain of the amplifier caused by the gain controller; and inputting the compensation signal generated in the image compensation adjustment operation for the FM signal to the I/Q compensation unit.

9. The control method of performing image-compensation-adjustment for an FM-AM demodulator according to claim 7, wherein when the AM signal is received, the local oscillator is put into sleep mode.

10. A control method of performing image compensation adjustment of an AM signal for an FM-AM demodulator, comprising the steps of:

setting a second selector to select the output signal from a second frequency divider;

inputting the selected signal to a second orthogonal mixer;

outputting an I signal to a third selector and a Q signal to the fourth selector, the I signal and Q signal are generated by multiplying a image signal frequency from the second frequency divider by the local oscillation signal frequency from a first frequency divider at the second orthogonal mixer;

setting a third selector to select the I signal output from the second orthogonal mixer;

inputting the I signal output from the second orthogonal mixer to a I/Q compensation unit through a first filter and a first amplifier;

setting a fourth selector to select the Q signal output from the first orthogonal mixer;

inputting the Q signal output from the second orthogonal mixer to the I/Q compensation unit through a second filter and a second amplifier; and adjusting phase and gain on one of the I and Q signals or both of the I and Q signals in the I/Q compensation unit in accordance with the compensation signal.

11. The control method of claim 10, wherein, when the AM signal is demodulated, further comprising the steps of:

setting a second selector to select the signal output from the AM amplifier;

inputting the signal from the AM amplifier to the second orthogonal mixer;

canceling the fixed gain of the amplifier caused by the gain controller; and inputting the compensation signal generated at the image-compensation-adjustment operation for the AM signal to the I/Q compensation unit.

12. The control method of performing image-compensation-adjustment for an FM-AM demodulator according to claim 10, wherein when the AM signal is received, the local oscillator is put into sleep mode.

* * * * *